(12) United States Patent
Hou (10) Patent No.: US 8,737,156 B2
(45) Date of Patent: May 27, 2014

(54) MAPPING BETWEEN TWO BUSES USING SERIAL ADDRESSING BITS

(71) Applicant: Ching-Min Hou, Taichung (TW)

(72) Inventor: Ching-Min Hou, Taichung (TW)

(73) Assignee: ITE Tech. Inc., Hsinchu (TW)

( * ) Notice: Subject to any disclaimer, the term of this patent is extended or adjusted under 35 U.S.C. 154(b) by 30 days.

(21) Appl. No.: 13/656,758

(22) Filed: Oct. 22, 2012

(65) Prior Publication Data

US 2013/0100736 A1 Apr. 25, 2013

Related U.S. Application Data

(60) Provisional application No. 61/550,915, filed on Oct. 24, 2011.

(51) Int. Cl.
- *G11C 8/10* (2006.01)
- *G11C 8/12* (2006.01)
- *G06F 12/00* (2006.01)
- *G06F 12/02* (2006.01)

(52) U.S. Cl.
CPC .. *G11C 8/10* (2013.01); *G11C 8/12* (2013.01); *G06F 12/00* (2013.01); *G06F 12/02* (2013.01)

USPC ........... 365/230.01; 365/185.05; 365/185.11; 365/230.03; 365/230.06; 711/202; 711/E12.082

(58) Field of Classification Search
CPC ............ G11C 8/12; G11C 8/10; G11C 16/08; G06F 12/00; G06F 12/02; G06F 12/0246
USPC ............. 365/185.05, 185.11, 230.01, 230.03, 365/230.06; 711/202, E12.082
See application file for complete search history.

(56) References Cited

U.S. PATENT DOCUMENTS

| | | | |
|---|---|---|---|
| 2009/0282189 A1* | 11/2009 | Best et al. ...................... | 711/106 |
| 2010/0235590 A1* | 9/2010 | Tam .............................. | 711/149 |

* cited by examiner

*Primary Examiner* — Ly D Pham
(74) *Attorney, Agent, or Firm* — Litron Patent and Trademark Office; Min-Lee Teng (57) ABSTRACT

A solution is provided to flexibly choose a combination of flash memory devices to reduce the overall cost of the flash memory devices or increase the overall utilization of the flash memory devices, while satisfying the capacity requirements for the flash memory devices in a system design, wherein a decoding unit is used for determining which flash memory devices will be accessed and re-mapping incoming serial addressing bits, for accessing one flash memory device, into an outgoing serial addressing bits for accessing another flash memory device.

15 Claims, 8 Drawing Sheets

MAPPING BETWEEN TWO BUSES USING SERIAL ADDRESSING BITS

CROSS REFERENCE TO RELATED APPLICATIONS

This application claims the benefit of priority of U.S. Provisional Application No. 61/550,915, filed Oct. 24, 2011, and titled "Decode Two Flashes into One Flash", the contents of which are herein incorporated by reference in its entirety.

BACKGROUND OF THE INVENTION

I. Field of the Invention

The invention relates in general to an embedded system and, in particular, to an embedded controller integrated with a chipset controller for accessing flash memory devices.

II. Background of the Invention

Figure 1:
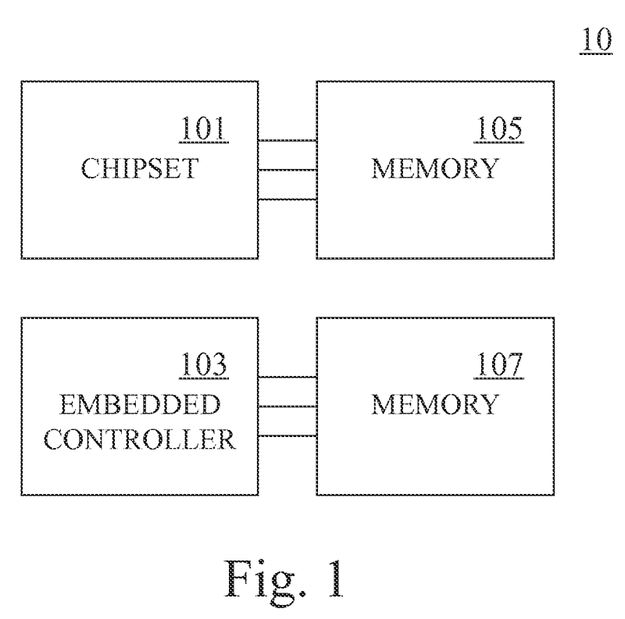
FIG. 1 illustrates architecture of a conventional system.

Conventionally, as shown in FIG. 1, a system 10 includes a chipset 101, an embedded controller 103, a first set of memory devices 105, and a second set of memory devices 107. The chipset 101 accesses the first set of memory devices 105 and the embedded controller 103 accesses the second set of memory devices 107, respectively. Typically, both the first set of memory devices 105 and the second set of memory devices 107 are flash memory devices. A flash memory device can be in a particular size, such as 1 MB, 2 MB, 4 MB, or 8 MB bits. For example, the chipset 101 requires a 5 MB memory and the embedded controller 103 requires a 3 MB memory. In order to satisfy the requirements, the first set of memory 105 can be an 8 MB flash memory device or a combination of a 1 MB and a 4 MB flash memory devices; and the second set of memory 107 can be a 4 MB flash memory device or a combination of a 1 MB and a 2 MB memory device. As a consequence, although the chipset 101 and the embedded controller 103 require only 8 MB size of flash memory in total, there are more than 8 MB size of flash memory are actually used, which is costly and takes a bigger space to accommodate the flash memory devices.

In another example, the price of a flash memory device is not actually proportional to its capacity; and it tends to bear a higher price for a single large-size flash memory device compared with an equivalent capacity of several small-size flash memory devices.

Therefore, what is need is a solution to flexibly choose a combination of flash memory devices to reduce the overall cost of the flash memory devices or increase the overall utilization of the flash memory devices.

SUMMARY OF THE INVENTION

One object of this invention is to provide a solution to flexibly choose a combination of flash memory devices to reduce the overall cost of the flash memory devices or increase the overall utilization of the flash memory devices, while satisfying the capacity requirements for the flash memory devices in a system design In one embodiment discloses an apparatus for accessing memory devices, wherein each of the memory devices uses serial addressing bits for accessing, comprising: a first bus, for transferring a first plurality of serial addressing bits of a first address range for accessing a first memory device; a second memory device; a third memory device; a decoding unit, for determining if the first plurality of serial addressing bits of the first address range is in a second address range directed to access the second memory device or a third address range directed to access the third memory device, wherein the first plurality of serial addressing bits is re-mapped to a second plurality of serial addressing bits for accessing the directed memory device. In one embodiment, the apparatus for accessing memory devices, wherein the size of the first memory device is 8M; the second memory device is 4M; and the size of the third memory device is 4M.

In one embodiment, a chipset controller is connected to the first bus of the above-mentioned apparatus, wherein the first bus comprises a first clock, a first serial input, a first serial output and a first chip-select for accessing the first memory device; and the decoding unit of the above-mentioned apparatus is in an embedded controller, wherein the embedded controller is connected to the first bus capable of accessing the first memory device and is connected to the second and third memory devices through a second bus and a third bus respectively, wherein a read or write cycle of the first memory device is redirected to the second or the third memory device through the decoding unit in the embedded controller.

In one embodiment, a chipset controller is connected to a plurality of flash memory devices using a common bus with a selection signal to select each of the plurality of flash memory devices; and the embedded controller can access the plurality of flash memory devices by using the common bus while the chipset controller is isolated from the common bus by holding each of the outputs, from the chipset controller, to the common bus in a tri-state. Therefore, the embedded controller can perform programming operations to each of the flash devices easily. In addition, the embedded controller can connect to a second plurality of flash memory devices for its own activity as well.

In one embodiment, a system comprises a chipset, an embedded controller, a first memory module, and a second memory module. The chipset is connected to the embedded controller. Also, the first and the second memory modules are connected to the embedded controller. The embedded controller re-arranges the two memory modules so that the first memory module and one portion of the second memory module is used by the chipset and the other portion of the second memory module is assigned to the embedded controller itself.

BRIEF DESCRIPTION OF DRAWINGS

The foregoing aspects and many of the accompanying advantages of this invention will become more readily appreciated as the same becomes better understood by reference to the following detailed description, when taken in conjunction with the accompanying drawings, wherein.

DETAILED DESCRIPTION OF EMBODIMENT

The detailed explanation of the present invention is described as follows. The described preferred embodiments are presented for purposes of illustrations and description, and they are not intended to limit the scope of the present invention.

Compared with the conventional architecture of an embedded system, this invention discloses an embedded controller capable of managing one or more memory modules so that a chipset and the embedded controller are able to share a set of memory modules.

Figure 2:
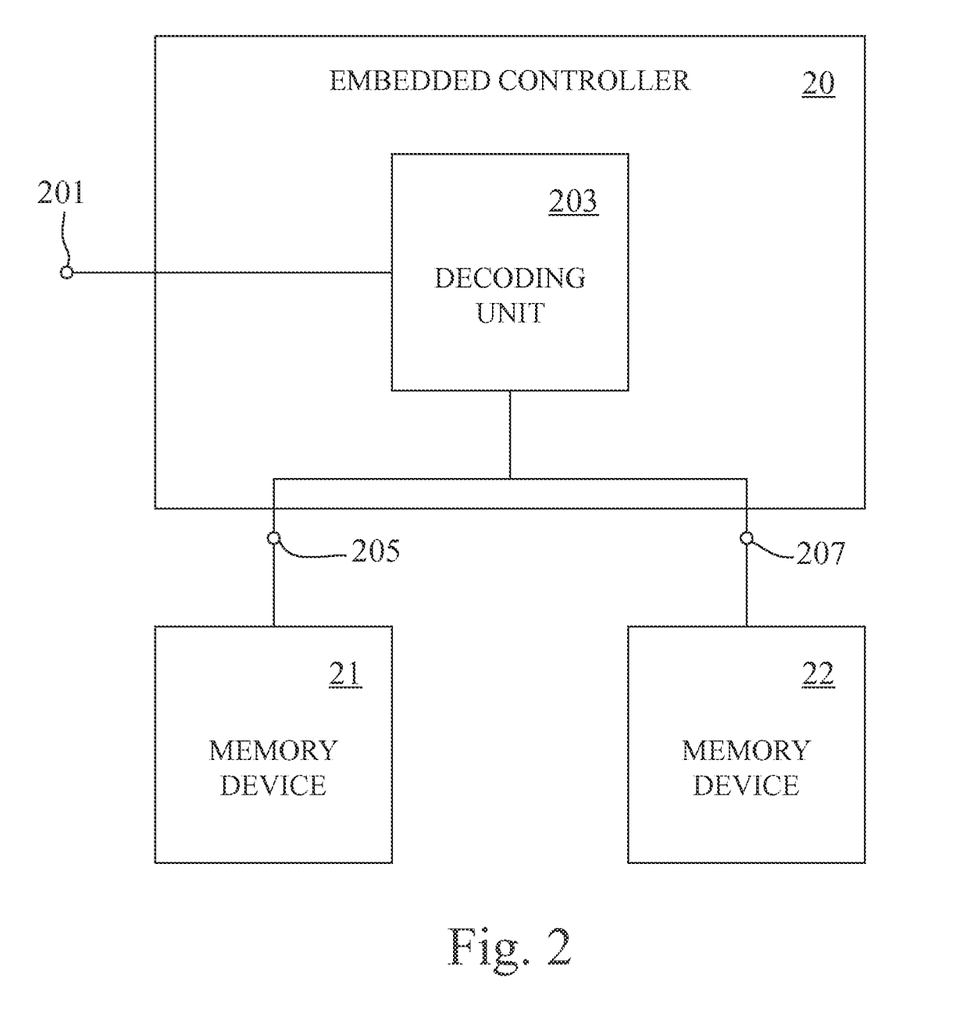
FIG. 2 illustrates how an embedded controller in this invention works.

In one embodiment, as shown in FIG. 2, an embedded controller 20 is connected to a first flash memory device 21 and a second flash memory device 22. The embedded controller 20 comprises a first bus 201, a decoding unit 203, a second bus 205 connected to the first memory device 21, and a third bus 207 connected to the second flash memory device 22. The first bus 201 is used for receiving a series of addressing bits. The decoding unit 203 determines which flash memory device, the first flash memory device 21 or the second flash memory device 22, is responsible, or assigned, to send data back for the address location defined by the series of addressing bits. While the first bus 201 receives the series of addressing bits for accessing data, the decoding unit 203 decodes the series of addressing bits to determine which flash device will be accessed and re-maps the series of addressing bits into corresponding serial addressing bits for accessing the second or the third flash memory device. Then, the embedded controller 20 transfers the re-mapped address to the directed flash memory device via the second bus 205 or the third bus 207.

Figure 3:
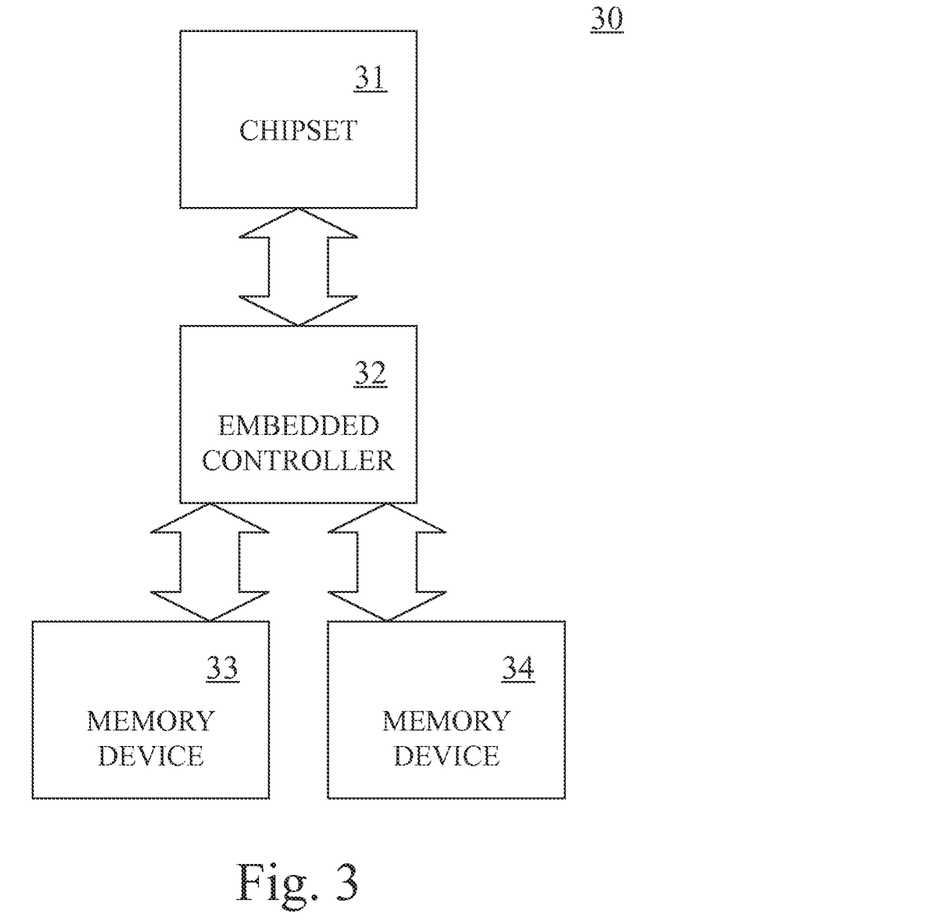
FIG. 3 illustrates how a reading/writing operation is performed with this invention.

FIG. 3 illustrates how a read or write operation is performed according to one embodiment of this invention, wherein a system 30 includes a chipset 31, an embedded controller 32, a first memory device 33, and a second memory device 34. The chipset 31 sends a writing command, a data, and an address indicating where to write the data; and the embedded controller 32 decodes the address to a device number of a particular flash memory device and a corresponding address of the particular flash memory device for writing the data. For example, the writing address is decoded to the first flash memory device 33 and a first address thereof, and then the writing command, the data, and the first address are then transferred to the first memory device 33 by the embedded controller 32.

While the chipset 31 sends a reading command and an address to read a data, the embedded controller 32 decodes the address to a device number of a particular flash memory device and a corresponding address of the particular flash memory device for reading the data. In such case, the address is decoded to the second flash memory device 34 and a second address. The reading command and the second address are then transferred to the second flash memory device 34 by the embedded controller 32. Afterwards, the second memory device 34 sends the data, via the embedded controller 32, to the chipset 31.

Figure 4A:
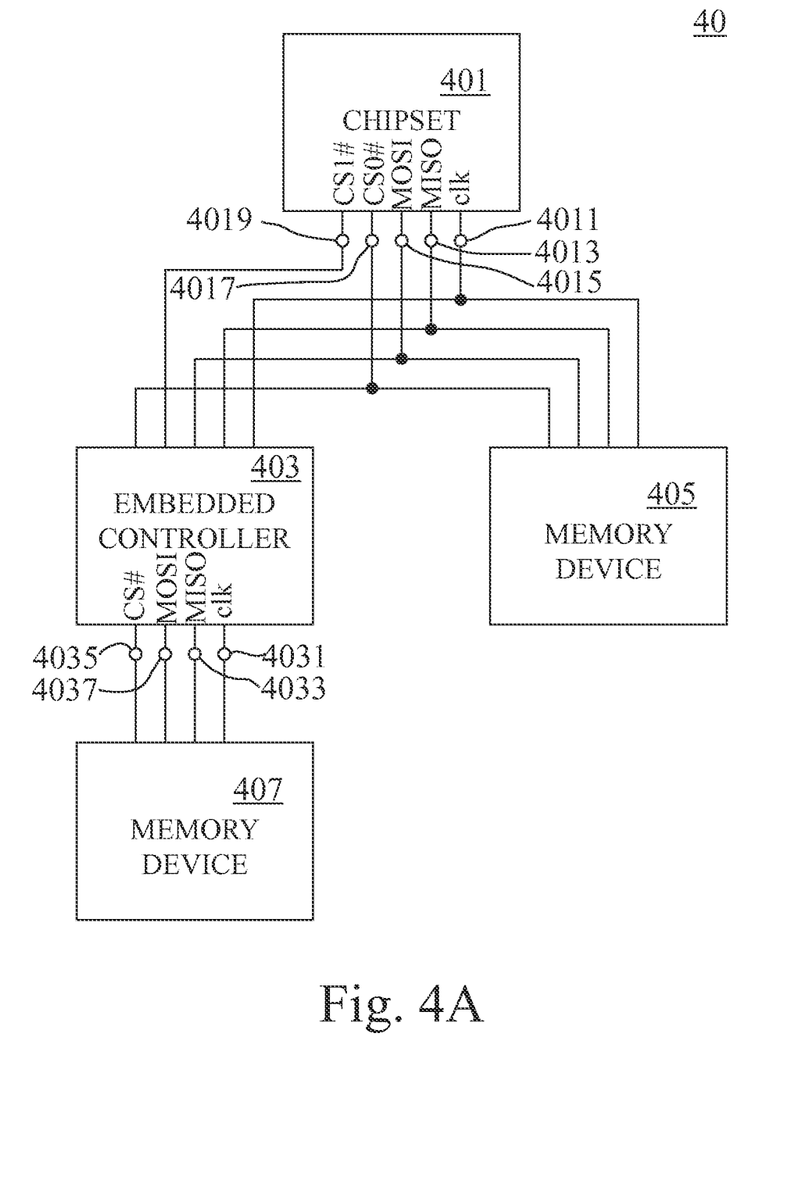
FIG. 4A illustrates a preferred embodiment of this invention.

In one embodiment, as illustrated in FIG. 4A, a system 40 includes a chipset 401, an embedded controller 403, a first flash memory device 405, and a second flash memory device 407. The chipset 401 has a first clock port 4011, a first master-in-slave-out (MISO) port 4013, a first master-out-slave-in (MOSI) port 4015, a first chip-selection port 4017, and a second chip-selection port 4019. The embedded controller 403 has a second clock port 4031, a second MISO port 4033, a second MOSI port 4035, and a third chip-selection port 4037.

Figure 4B:
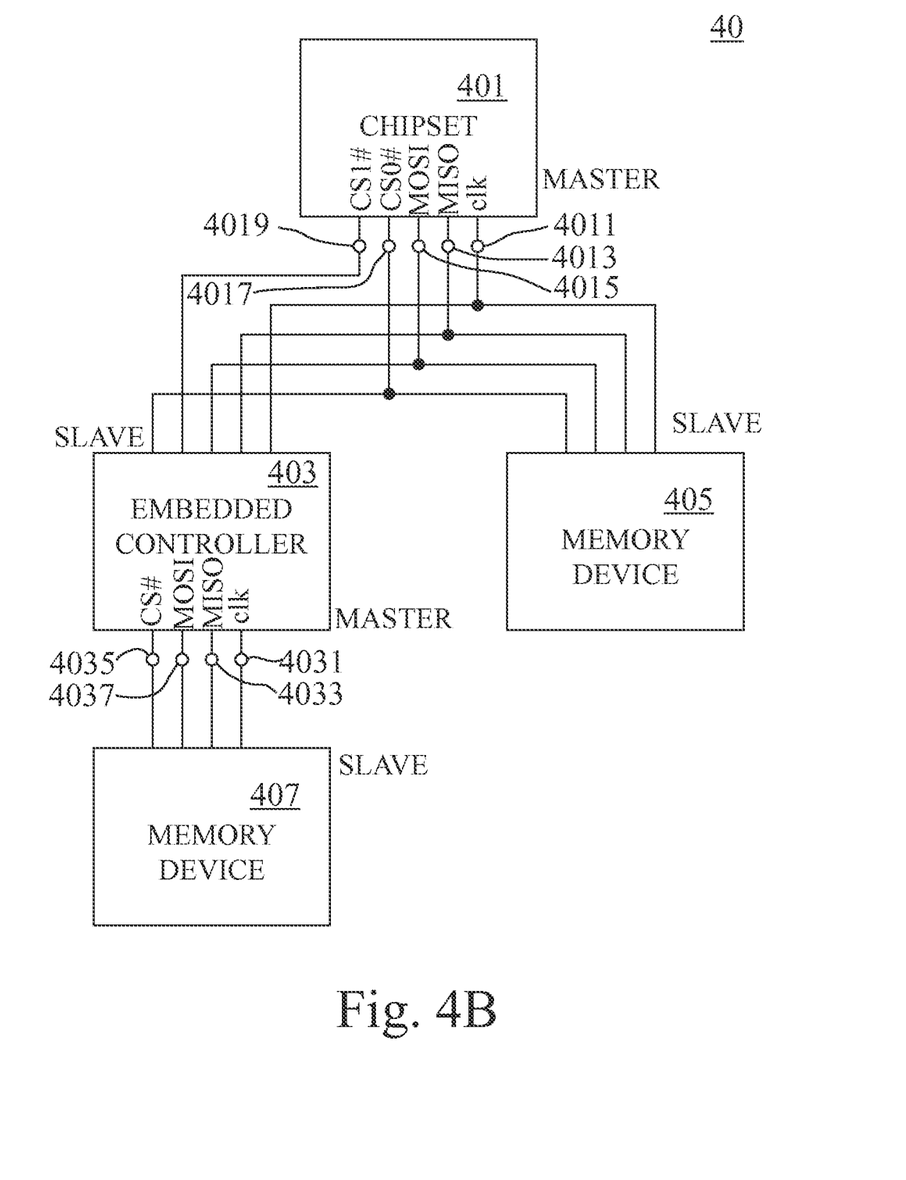
FIG. 4B illustrates a first condition of the embodiment of this invention in FIG. 4A.

Please refer to FIG. 4B. When the chipset 401, as a master, is accessing the first memory 405 or the embedded controller 403, the embedded controller 403 becomes a slave. That is, to the chipset 401, the embedded controller 403 is a slave device. However, the embedded controller 403 is still a master device to the second memory 407.

Figure 4C:
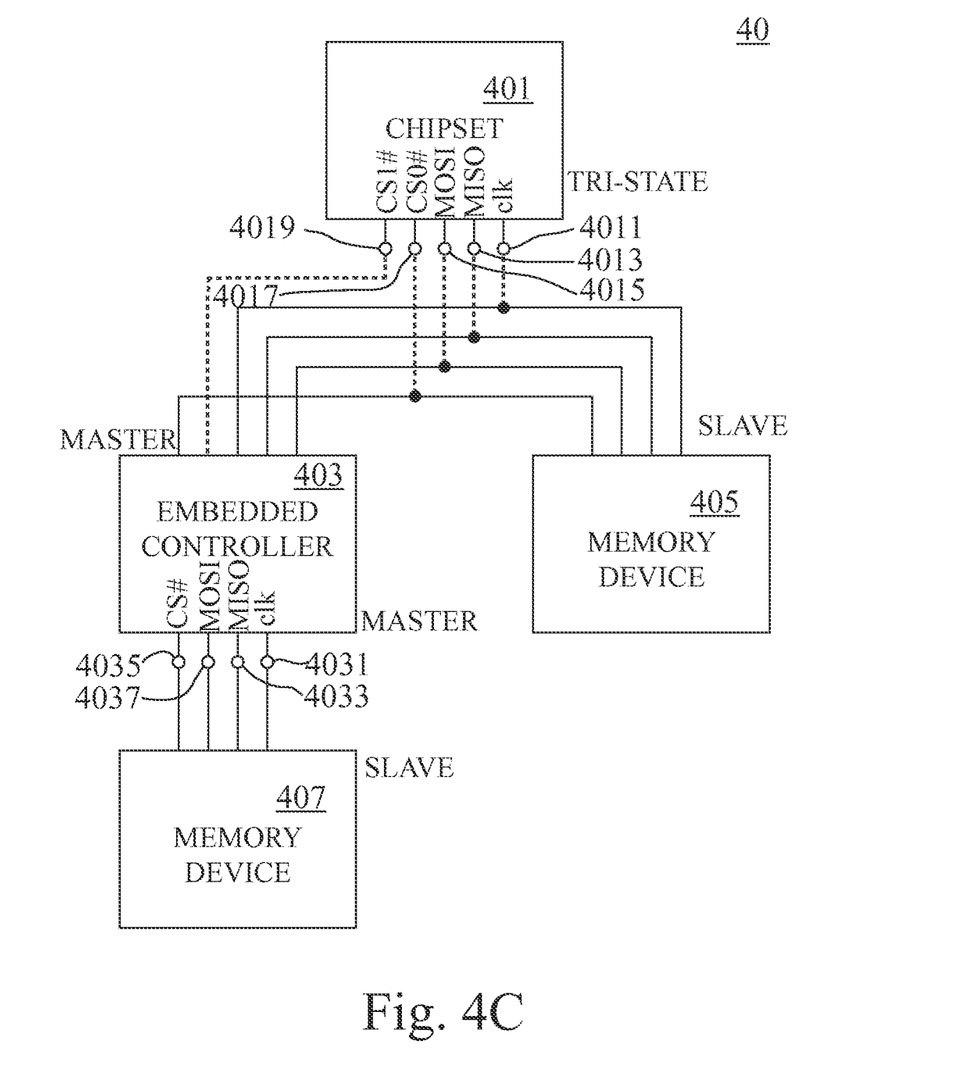
FIG. 4C illustrates a second condition of the embodiment of this invention in FIG. 4A.

Please refer to FIG. 4C. While the chipset 401 is not accessing any devices, the chipset 401 holds all its ports (from 4011 to 4019) in tri-state. Under such circumstance, the embedded controller 403 is capable of programming the first memory 405 and the second memory 407.

Figure 5A:
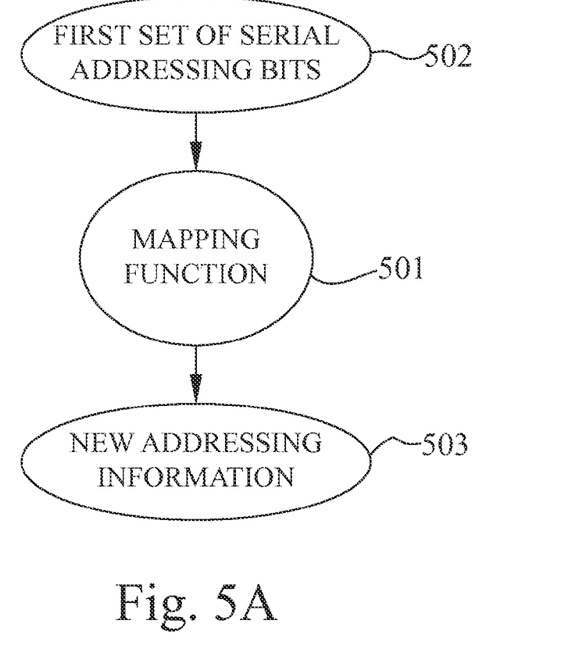
FIGS. 5A and 5B illustrate a first method for re-arranging addressing bits and corresponding flow chart.
Figure 5B:
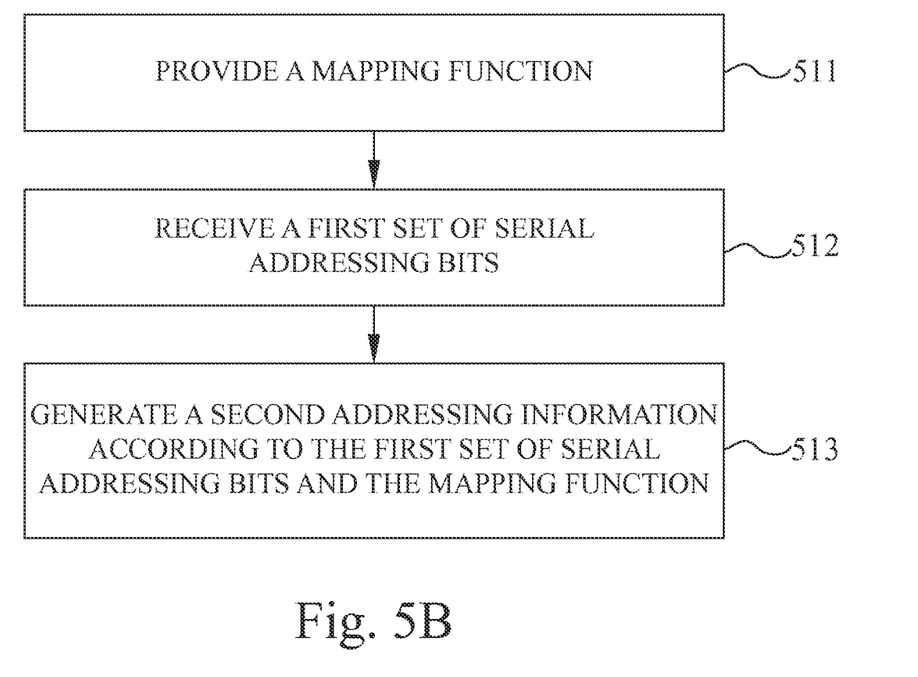

In one embodiment, please refer to FIG. 5A which illustrate a first method in this invention to re-arrange a serial addressing bit. A mapping function 501 is stored in an embedded controller or in its corresponding memory. While a first set of serial addressing bits 502 is sent to the embedded controller, the embedded controller uses the mapping function 501 to generate a new addressing information 503. Now please refer to FIG. 5B which depicts a flow chart of one preferred embodiment of this invention. First, a mapping function is provided, as shown in step 511. Then, a first set of serial addressing bits is received, as shown in step 512. In step 513, according to the first set of serial addressing bits and the mapping function, a second addressing information is generated. The second addressing information includes a device number of a particular flash device to be accessed and corresponding serial addressing bits for accessing the particular flash device.

Figure 6A:
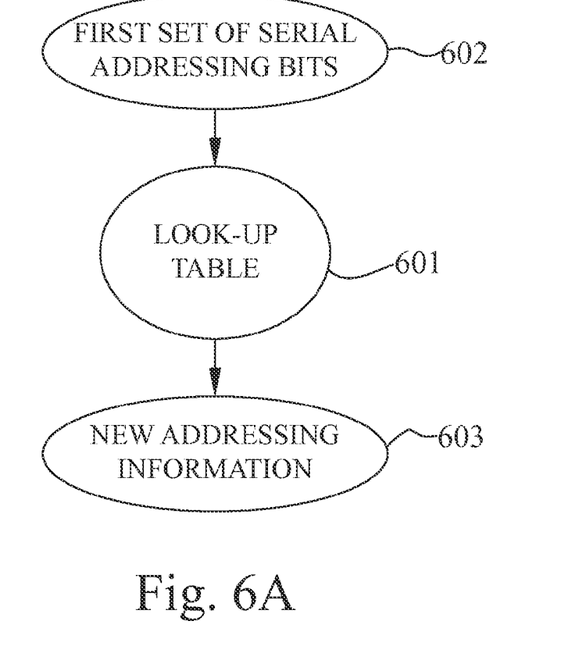
FIGS. 6A and 6B illustrate a second method for re-arranging addressing bits and corresponding flow chart.
Figure 6B:
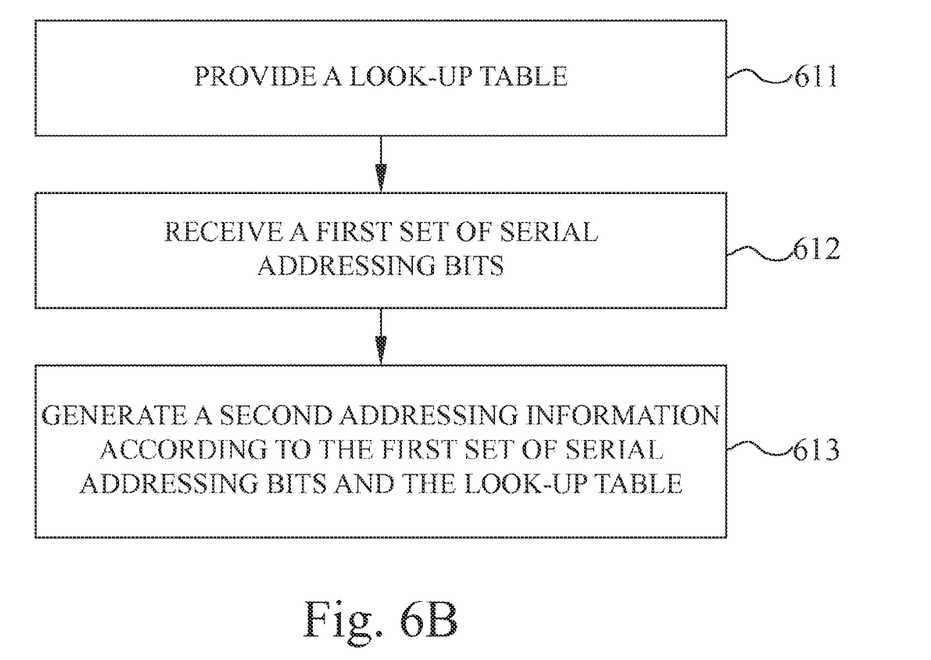

In one embodiment, please refer to FIG. 6A which illustrates one way to re-arrange a serial of addressing bits. While a first set of serial addressing bits 602 is sent to the embedded controller, the embedded controller uses a LUT 601 to generate a new addressing information 603. Now please refer to FIG. 6B which depicts a flow chart of one preferred embodiment in accordance with this invention. First, a look-up table (LUT) is provided, as in step 611. Then, a first set of serial addressing bits is received, as in step 612. In step 613, according to the first set of serial addressing bits and the LUT, a second addressing information is generated. The second addressing information includes a device number of a particular flash device to be accessed and its corresponding addressing bits for accessing the particular flash device.

In one embodiment, for example, a first series of addressing bits capable of accessing an 8 MB flash memory device will be re-mapped into a second plurality of serial addressing bits for accessing two 4 MB flash memory devices, wherein the length of the first series of addressing bits is 1-bit longer than that of a second series of addressing bits for accessing a 4 MB flash memory device. In such case, a embedded controller can re-map the first series of addressing bits into the second series of addressing bits by simply removing the most-significant-bit (MSB) of the first series of addressing bits. At the same time, the MSB of the first series of addressing bits can be used to determine which 4 MB flash memory device will be accessed.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

What is claimed is:

1. An apparatus for accessing memory devices, wherein each of the memory devices uses serial addressing bits for accessing, comprising:
   a first bus, for transferring a first plurality of serial addressing bits capable of accessing a first memory device in a first address range;
   a second memory device;
   a third memory device;
   a decoding unit, for determining if the first plurality of serial addressing bits is in a second address range within the first address range or a third address range within the first address range, wherein the second address range is directed to access the second memory device and the third address range is directed to access the third memory device, wherein the first plurality of serial addressing bits is re-mapped to a second plurality of serial addressing bits for accessing the directed memory device.

2. The apparatus for accessing memory devices according to claim 1, the second memory device is a flash memory device and the third memory device is a flash memory device.

3. The apparatus for accessing memory devices according to claim 1, wherein the second memory device is accessed through a second bus for transferring a second plurality of serial addressing bits of the second address range to the second memory device; and the third device is accessed through a third bus for transferring a third plurality of serial addressing bits of the third address range to the third memory device.

4. The apparatus for accessing memory devices according to claim 1, wherein the second plurality of serial addressing bits is derived by eliminating the most significant bit of the first plurality of serial addressing bits and maintaining the rest of the first plurality of serial addressing bits; and the third plurality of serial addressing bits is derived by eliminating the most significant bit of the first plurality of serial addressing bits and maintaining the rest of the first plurality of serial addressing bits.

5. The apparatus for accessing memory devices according to claim 3, wherein the second bus comprises a first clock, a first serial input, a first serial output and a first chip-select to access the second memory device; and the third bus uses the first clock, the first serial input, the first serial output and a second chip-select to access the third memory device, wherein the second plurality of serial addressing bits and the third plurality of serial addressing bits are transmitted on the first serial output; and the first chip-select is enabled when the most significant bit of the first plurality of serial addressing bits is zero and the second chip-select is enabled when the most significant bit of the first plurality of serial addressing bits is one.

6. The apparatus for accessing memory devices according to claim 4, wherein the size of the first memory device is 8M; the second memory device is 4M; and the size of the third memory device is 4M.

7. The apparatus for accessing memory devices according to claim 1, further comprising a chipset controller connected to the first bus, wherein the first bus comprises a first clock, a first serial input, a first serial output for transmitting a first plurality of serial addressing bits and a first chip-select for accessing the first memory device.

8. The apparatus for accessing memory devices according to claim 7, wherein the decoding unit is in an embedded controller, wherein the embedded controller is connected to the first bus for accessing the first memory device and is connected to the second and third memory devices through a second bus and a third bus respectively.

9. The apparatus for accessing memory devices according to claim 8, wherein the second bus comprises a first clock, a first serial input, a first serial output and a second first chip-select to access the second memory device; and the third bus uses the first clock, the first serial input, the first serial output and a third chip-select to access the third memory device, wherein the second chip-select is enabled when the first chip-select is enabled and the second address range is decoded; and the third chip-select is enabled when the first chip-select is enabled and the third address range is decoded.

10. The apparatus for accessing memory devices according to claim 9, further comprising a fourth memory device connected to the first clock, the first serial input, the first serial output and a fourth chip-select of the chipset controller for accessing the fourth memory device.

11. The apparatus for accessing memory devices according to claim 10, wherein the embedded controller is capable of programming the second, the third and the fourth memory device.

12. The apparatus for accessing memory devices according to claim 10, wherein the embedded controller is capable of accessing the second, the third and the fourth memory device.

13. The apparatus for accessing memory devices according to claim 10, wherein the chipset controller is capable of accessing the second, the third and the fourth memory device.

14. A system for accessing memory devices, wherein each of the memory devices uses serial addressing bits for accessing, comprising:
   a chipset;
   an embedded controller;
   a first bus, connected between the chipset and the embedded controller, for transferring a first plurality of serial addressing bits capable of accessing a first memory device in a first address range;
   a second memory device, connected to the embedded controller via a second bus;
   a third memory device, connected to the embedded controller via a third bus;
   wherein the embedded controller determines if the first plurality of serial addressing bits is in a second address range within the first address range or a third address range within the first address range, wherein the second address range is directed to access the second memory device and the third address range is directed to access the third memory device, wherein the first plurality of serial addressing bits is re-mapped to a second plurality of serial addressing bits for accessing the directed memory device.

15. A system for accessing memory devices, wherein each of the memory devices uses serial addressing bits for accessing, comprising:
   a chipset;
   an embedded controller;
   a first bus, connected between the chipset and the embedded controller, for transferring a first plurality of serial addressing bits capable of accessing a first memory device in a first address range;
   a second memory device, connected to the chipset via the first bus;
   a third memory device, connected to the embedded controller via a second bus;
   wherein the embedded controller determines if the first plurality of serial addressing bits is in a second address range within the first address range or a third address range within the first address range, wherein the second address range is directed to access the second memory device and the third address range is directed to access the third memory device, wherein the first plurality of serial addressing bits is re-mapped to a second plurality of serial addressing bits for accessing the directed memory device.

* * * * *